United States Patent [19]
Tasaka

[11] Patent Number: 5,490,106
[45] Date of Patent: Feb. 6, 1996

[54] SEMICONDUCTOR READ ONLY MEMORY DEVICE WITH MEMORY CELLS IMPLEMENTED BY INVERTED THIN FILM TRANSISTORS

[75] Inventor: Kazuhiro Tasaka, Tokyo, Japan

[73] Assignee: NEC Corporation, Japan

[21] Appl. No.: 305,163

[22] Filed: Sep. 13, 1994

[30] Foreign Application Priority Data

Sep. 14, 1993 [JP] Japan .................... 5-252234

[51] Int. Cl.[6] .............. G11C 17/00; G11C 11/34
[52] U.S. Cl. .............. 365/182; 365/104; 257/60; 257/74
[58] Field of Search ............... 365/182, 164, 365/174, 176, 178; 257/60, 74, 390, 391

[56] References Cited

U.S. PATENT DOCUMENTS 4,920,392  4/1990  Nishiura ................... 257/60
5,317,534  5/1994  Choi et al. ................ 365/178

FOREIGN PATENT DOCUMENTS 63-41224    8/1988  Japan .
63-239976  10/1988  Japan .
3187262     8/1991  Japan .
403280474  12/1991  Japan ..................... 257/60

Primary Examiner—David C. Nelms
Assistant Examiner—Huan Hoang
Attorney, Agent, or Firm—Ostrolenk, Faber, Gerb & Soffen

[57] ABSTRACT

A semiconductor mask ROM device has word lines embedded in a surface portion of a silicon substrate, a gate insulating layer covering the word lines and a silicon strips extending over the gate insulating layer and providing channel regions over the word lines, and the silicon strips are physically separated without a thick field oxide layer, thereby increasing the integration density of the memory cells.

6 Claims, 17 Drawing Sheets

SEMICONDUCTOR READ ONLY MEMORY DEVICE WITH MEMORY CELLS IMPLEMENTED BY INVERTED THIN FILM TRANSISTORS

FIELD OF THE INVENTION

This invention relates to a read only memory device, which is hereinbelow abbreviated as ROM device and, more particularly, to a mask ROM device for storing data information in high density.

DESCRIPTION OF THE RELATED ART

A typical example the mask ROM device is disclosed in Japanese Patent Publication of Unexamined Application No. 63-239976, and FIG. 1 illustrates the prior art mask ROM device. The prior art mask ROM device is fabricated on a p-type silicon substrate 1, and a thick field oxide layer 2 defines an active area for a memory cell block in the major surface of the p-type silicon substrate 1. A thin gate oxide film 3 covers the active area, and first gate electrodes 4a, 4b and 4c are provided on the thin gate oxide film 3 at intervals. The first gate electrodes 4a to 4c are covered with insulating films 5a, 5b and 5c, respectively, and channel regions 6a, 6b and 6c are selectively ion implanted with an n-type dopant impurity. The first gate electrodes 4a to 4c, the channel regions 6a to 6c and the thin gate oxide film 3 form memory cells M1, M2 and M3 each implemented by a kind of field effect transistor. In this instance, only the channel region 6a is doped with the n-type dopant impurity, and the memory cell M1 is operative in the depletion mode. The other memory cells M2 and M3 are operative in the enhancement mode.

Second gate electrodes 4d and 4e are provided on the gate oxide film 3 between the thin insulating films 5a to 5c covering the first gate electrodes 4a to 4c, and channel regions 6d and 6e are selectively ion implanted with the n-type dopant impurity. The second gate electrodes 4d and 4e, the channel regions 6d and 6e and the thin gate oxide film 3 form memory cells M4 and M5 each implemented by the field effect transistor. In this instance, the channel region 4e is doped with the n-type dopant impurity, and the memory cell M5 is operative in the depletion mode. On the other hand, the channel region 6d is prevented from the n-type dopant impurity, and the memory cell M4 is operative in the enhancement mode.

N-type impurity regions 7a and 7b are formed in peripheral sub-areas of the active area, and are electrically connected to a ground line and a bit line 8. The bit line 8 extends over an inter-level insulating layer 9 covering the memory cells M1, M4, M2, M5 and M3, and the memory cells M1, M4, M2, M5 and M3 form in combination the memory cell block arranged in a NAND configuration.

The programming is carried out through the ion-implantation into the channel regions 6a to 6e, and the first and second gate electrodes 4a/4b/4c and 4d/4e are selectively energized to see whether or not the memory cell block provides a current path from the bit line 8 to the ground line in a read-out operation.

The first and second gate electrodes 4a to 4e are arranged on the thin gate oxide film 3, and most of the active area is occupied by the first and second gate electrodes 4a to 4e. Therefore, the memory cells M1 to M5 of fairly high density are fabricated on the active area.

However, each memory cell block occupies an active area electrically isolated from another active area by means of the thick field oxide layer 2, and the thick field oxide layer 2 consumes a substantial amount of area. Therefore, a problem inherent in the prior art mask ROM device is the integration density of the memory cells hardly increased in so far as the minimum design rule is changed.

SUMMARY OF THE INVENTION

It is therefore an important object of the present invention to provide a read only memory device which has a large number of memory cells without increase of a real estate.

To accomplish the object, the present invention proposes to form gate electrodes of memory cells or word lines in a surface portion of a semiconductor substrate under a silicon layer providing channel regions.

In accordance with the present invention, there is provided a semiconductor read only memory device fabricated on a first semiconductor layer, comprising: a plurality of memory cell blocks each implemented by series combinations of memory cells and switching transistors, each of the memory cell blocks comprising a) a plurality of conductive strips formed in a surface portion of the first semiconductor layer and having respective top surfaces, the plurality of conductive strips providing gate electrodes of the series combinations of memory cells and switching transistors, b) a plurality of first insulating films inserted between the plurality of conductive strips for electrically isolating the plurality of conductive strips from one another, c) a gate insulating layer covering the top surfaces of the plurality of conductive strips, and d) a plurality of second semiconductor layers extending over the gate insulating layer and spaced apart from one another, the plurality of second semiconductor layers being respectively associated with the series combinations of memory cells and switching transistors for providing channel regions of the memory cells and channel regions the switching transistors.

BRIEF DESCRIPTION OF THE DRAWINGS

The features and advantages of the read only memory device according to the present invention will be more clearly understood from the following description taken in conjunction with the accompanying drawings in which.

DESCRIPTION OF THE PREFERRED EMBODIMENTS

First Embodiment

Figure 1:
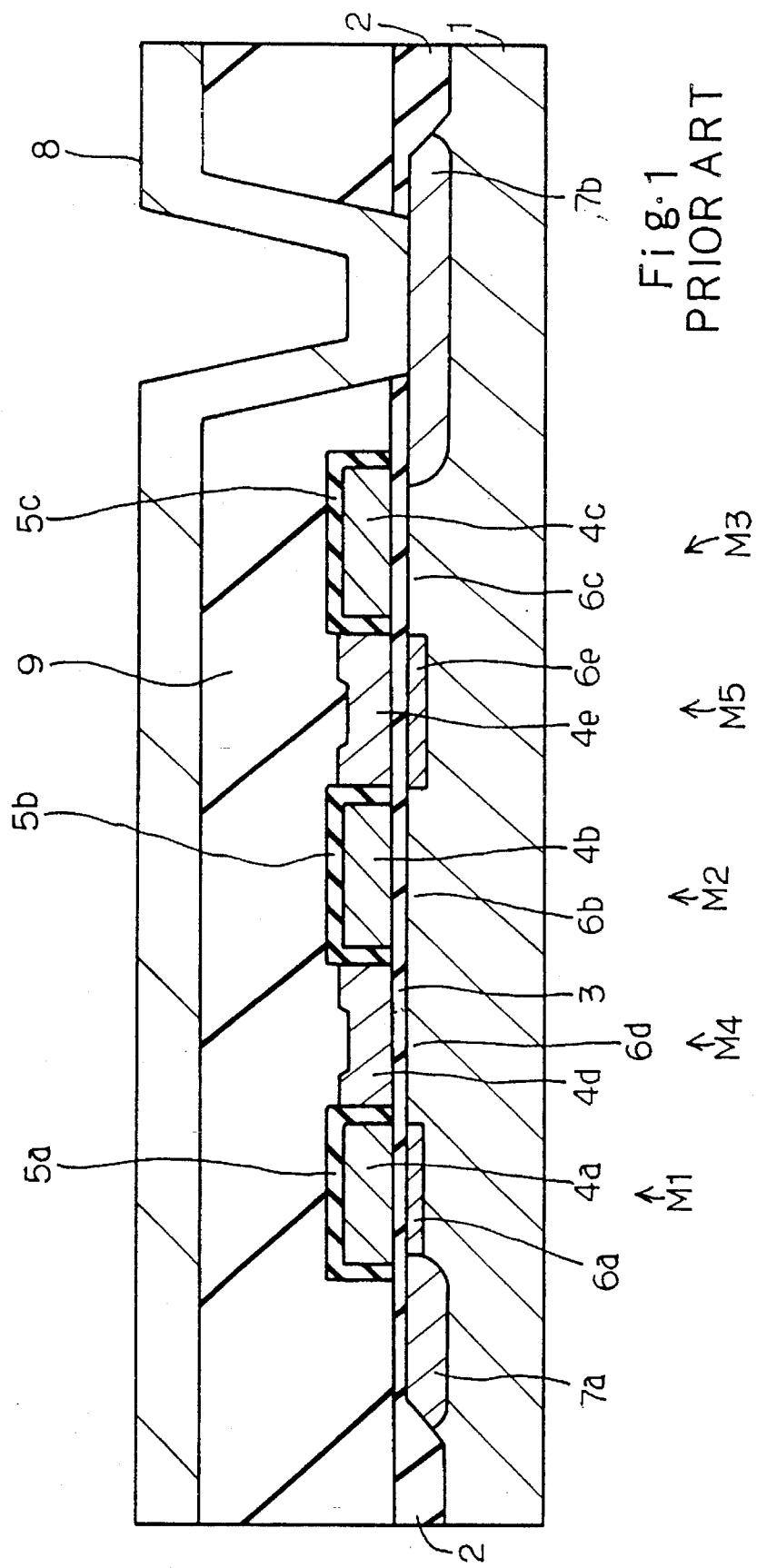
FIG. 1 is a cross sectional view showing the structure of the prior art read only memory device.
Figure 2:
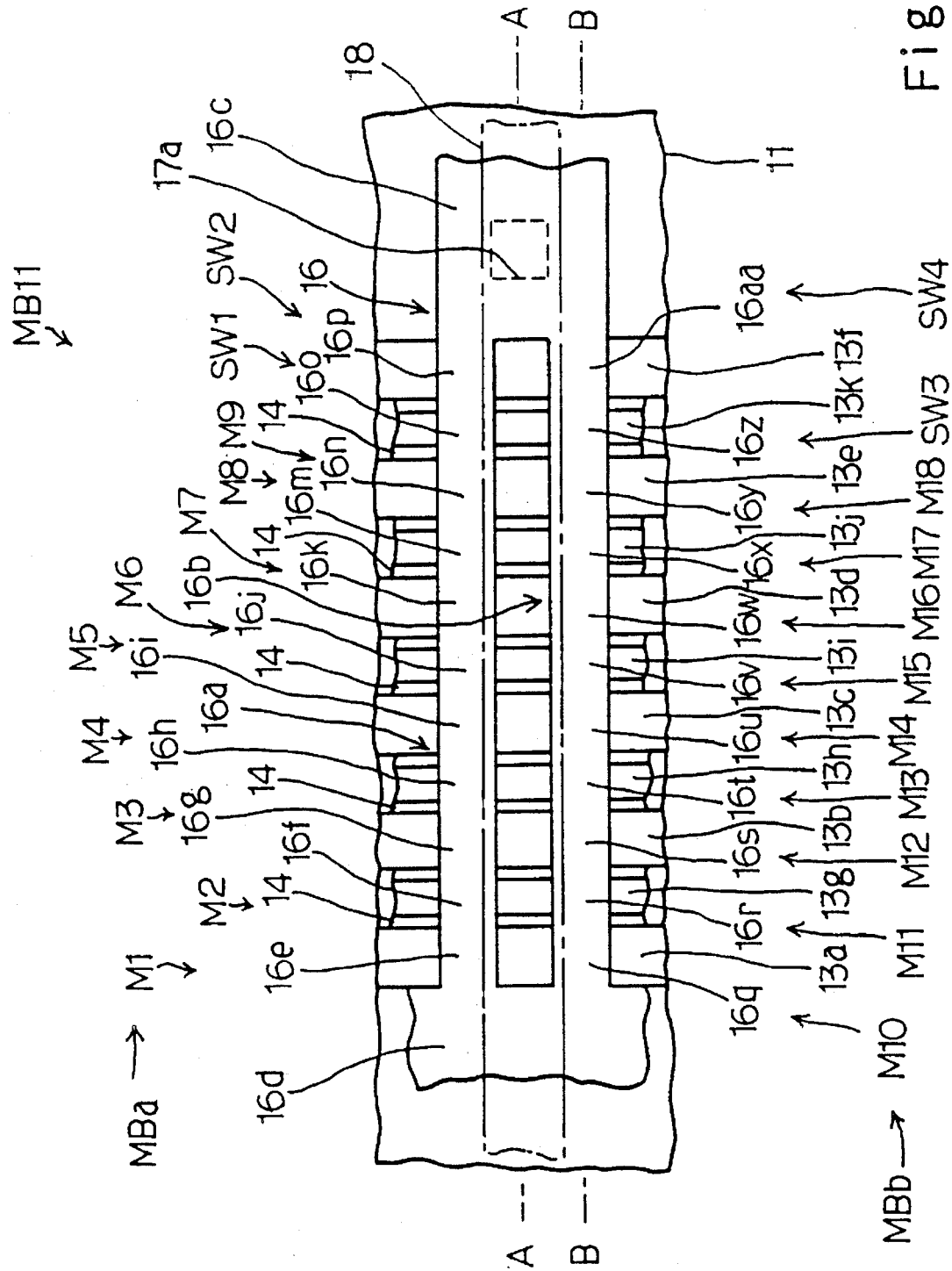
FIG. 2 is a plan view showing the layout of a memory cell block incorporated in a read only memory device according to the present invention.
Figure 3:
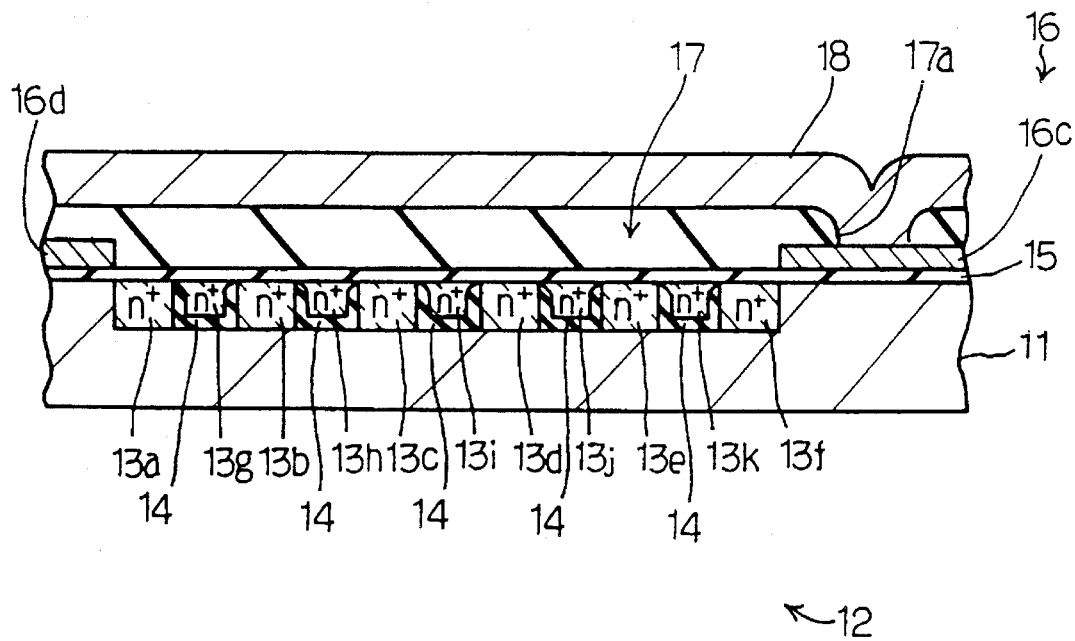
FIG. 3 is a cross sectional view taken along line A—A of FIG. 2 and showing the structure of the memory cell block.
Figure 4:
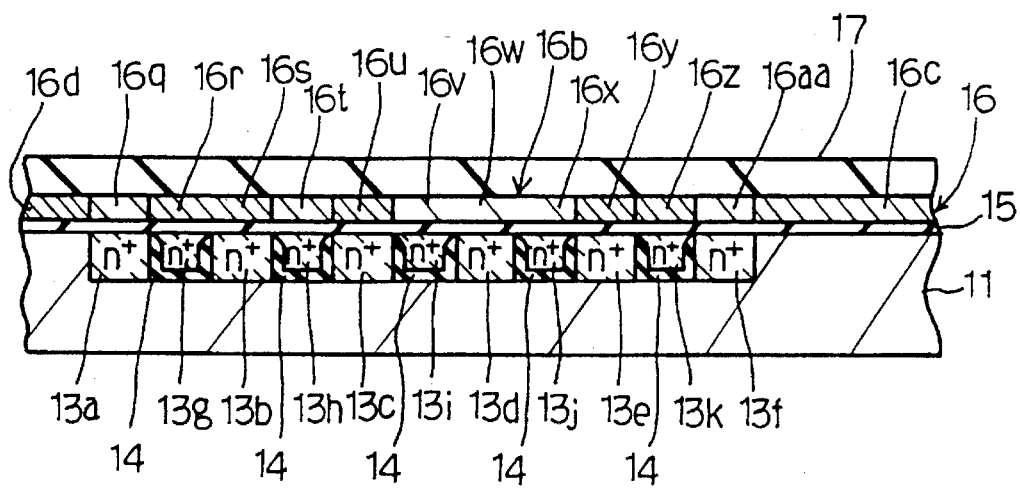
FIG. 4 is a cross sectional view taken along line B—B of FIG. 2 and showing the structure of the memory cell block.

Referring to FIGS. 2, 3 and 4 of the drawings, a mask ROM device embodying the present invention is fabricated on a p-type silicon substrate 11, and a memory cell block MB11 12 incorporated in the mask ROM device. In this instance, the p-type silicon substrate 11 serves as a first semiconductor layer.

Heavily doped n-type impurity regions 13a, 13b, 13c, 13d, 13e and 13f are formed in a surface portion of the p-type silicon substrate 11 at intervals, and heavily doped n-type polysilicon strips 13g, 13h, 13i, 13j and 13k are embedded in the p-type silicon substrate 11 between the first heavily doped n-type impurity regions 13a to 13f. A thin silicon oxide film 14 covers each of the heavily doped n-type polysilicon strips 13g to 13k except for the top surface, and electrically isolates the heavily doped n-type polysilicon strip 13g, 13h, 13i, 13j or 13k from the adjacent heavily doped n-type impurity regions 13a/13b, 13b/13c, 13c/13d, 13d/13e or 13e/13f. The heavily doped n-type impurity regions 13a to 13f and the heavily doped n-type polysilicon strips 13g to 13k serve as a plurality of conductive strips.

A gate oxide film 15 covers the heavily doped n-type impurity regions 13a to 13f and the heavily doped n-type polysilicon strips 13g to 13k, and a silicon layer 16 extends over the gate oxide film 15.

As will be seen in FIG. 2, the silicon layer 16 is partially bifurcated into two central portions 16a and 16b, and both end portions 16c and 16d serve as a common drain region and a common source region. The central portion 16a is imaginarily separated into channel regions 16e, 16f, 16g, 16h, 16i, 16j, 16k, 16m, 16n, 16o and 16p, and the central portion 16b is similarly separated into channel regions 16q, 16r, 16s, 16t, 16u, 16v, 16w, 16x, 16y, 16z and 16aa. The channel regions 16e to 16aa are selectively doped with n-type dopant impurity such as, for example, phosphorous. In this instance, the channel regions 16e, 16p, 16r, 16s, 16u, 16y and 16z are doped with the n-type dopant impurity. The central portions 16a and 16b serves as a plurality of second semiconductor layers.

The heavily doped n-type impurity regions 13a to 13f and the heavily doped n-type polysilicon strips 13g to 13k are associated with the channel regions 16e to 16aa, and serve as gate electrodes for the respective channel regions 16e to 16aa. The channel regions 16e to 16aa, the gate electrodes under the respective channel regions 16e to 16aa and the gate oxide film 15 form field effect transistors along the two central portions 16a and 16b. The field effect transistors with the channel regions 16e to 16n serve as memory cells M1 to M9 coupled in series, and the field effect transistors with the channel regions 16o and 16p serve as switching transistors SW1 and SW2 coupled in series to the memory cells M1 to M9. Similarly, the field effect transistors with the channel regions 16q to 16y serve as a series of memory cells M10 to M18, and the field effect transistors with the channel regions 16z and 16aa serve as a series of switching transistors SW3 and SW4 coupled in series to the memory cells M10 to M18. The memory cells M1 to M9 form in combination a first memory cell sub-array MBa, and the other memory cells M10 to M18 form a second memory cell sub-array MBb.

As described hereinbefore, only the channel regions 16e, 16p, 16r, 16s, 16u, 16y and 16z are doped with the n-type dopant impurity. For this reason, the field effect transistors with these heavily doped channel regions are operative in the depletion mode, and the other field effect transistors are operative in the enhancement mode. Thus, the mask ROM device stores data bits in the form of operation mode, and the programming is carried out before delivery to a user.

The silicon layer 16 is covered with an inter-level insulating layer 17, and a bit line BL1 extends on the inter-level insulating layer 17. A contact hole 17a is formed in the inter-level insulating layer 17, and the bit line BL1 is held in contact through the contact hole 17a with the heavily doped drain region 16c of the silicon layer 16. Although the position of the contact hole 17a is indicated in FIG. 2, the inter-level insulating layer 17 and the thin gate oxide film 15 are deleted from FIG. 2 so as to clearly understand the layout of the memory cell block MB11.

Figure 5:
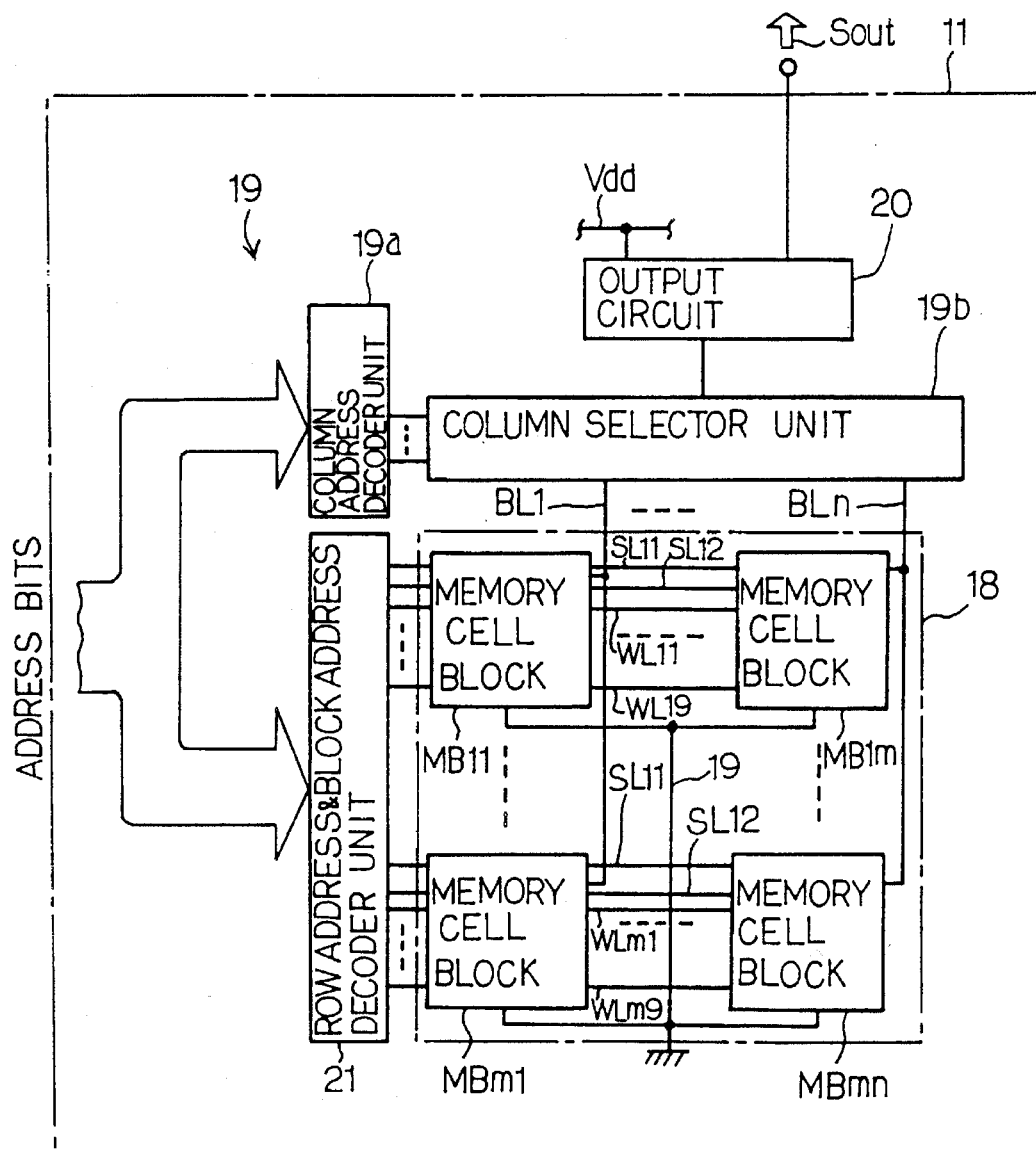
FIG. 5 is a block diagram showing the arrangement of the read only memory device according to the present invention.

The memory cell block forms a part of a memory cell array 18 together with other memory cell blocks MB1n, . . ., MBm1, . . . and MBmn as shown in FIG. 5. The columns of memory cell blocks MB11-MBm1 to MB1n-MBmn are respectively associated with bit lines BL1 to BLn, and a discharging line 19 is coupled to the source regions 16d of all the memory cell blocks MB11 to MBmn. All of the memory cell blocks MB11 to MBmn are similar in arrangement of the field effect transistors to one another. However, the memory cells of one memory cell block may be different in operation mode to the memory cells of another memory cell block.

Figure 6:
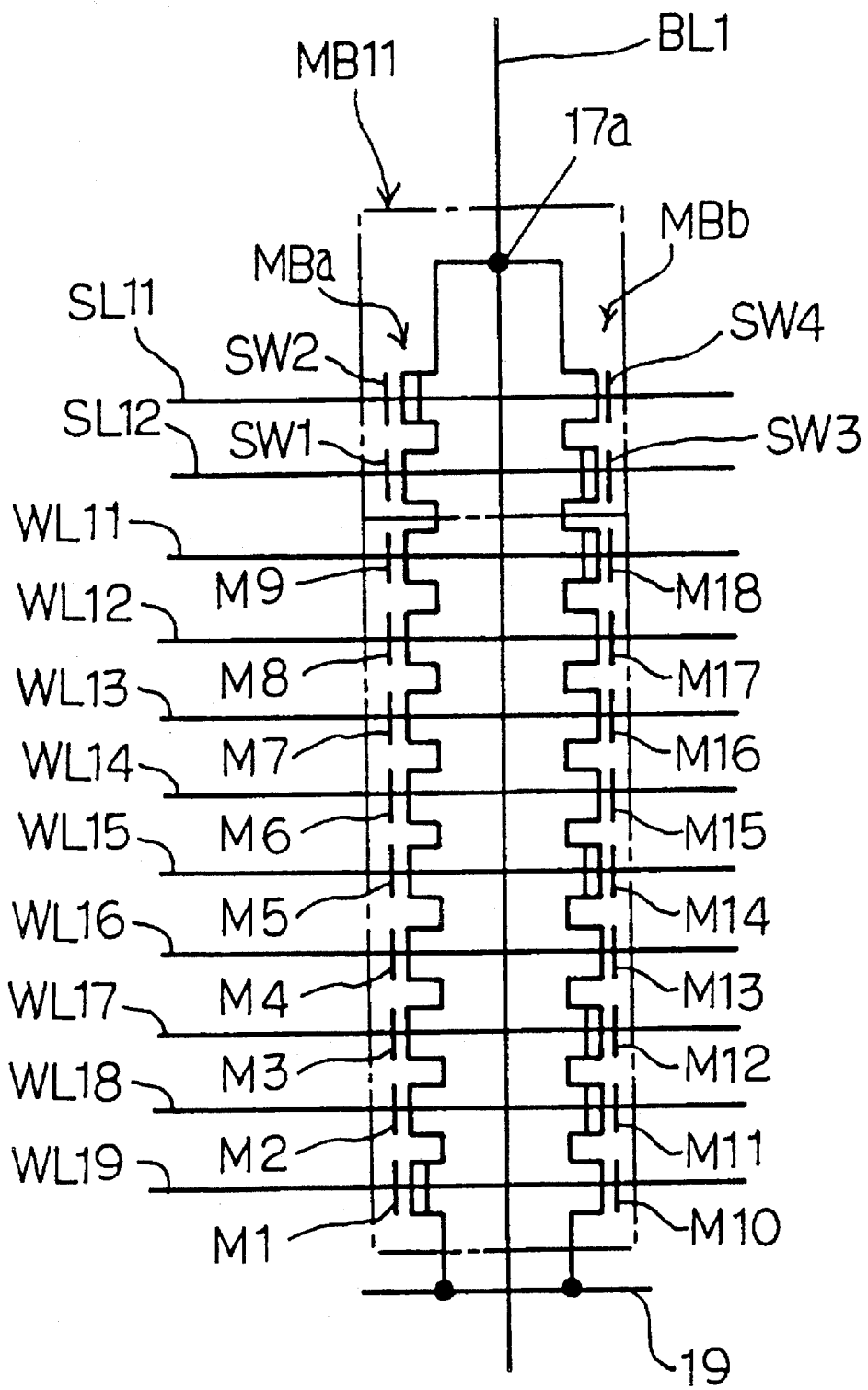
FIG. 6 is a circuit diagram showing the arrangement of a memory cell block incorporated in the read only memory device.

FIG. 6 illustrates the circuit configuration of the memory cell block MB11, and the first memory cell sub-array MBa and the second memory cell sub-array MBb are coupled in parallel between the bit line BL1 and the discharging line 19. The word line WL19, WL18, WL17, WL16, WL15, WL14, WL13, WL12, WL11 and the selecting lines SL12 and SL11 are implemented by the heavily doped n-type impurity regions/polysilicon strips 13a, 13g, 13b, 13h, 13c, 13i, 13d, 13j, 13e, 13k and 13f, respectively.

Turning back to FIG. 5 of the drawings, the rows of the memory cell blocks MB11-MB1n to MBm1-MBmn are respectively associated with sets of selecting/word lines SL11/SL12/WL11/. . . /WL19 to SL11/SL12/WLm1/. . . /WLm9. The selecting lines SL11/SL12 or SLm1/SLm2 allows the switching transistors SW1, SW2, SW3 and SW4 to couple one of the first and second memory cell sub-arrays MBa and MBb to the associated bit line BL1, . . . or BLn.

A column addressing system 19 is provided for the bit lines BL1 to BLn, and comprises a column address decoder unit 19a and a column selector unit 19b. The column address decoder unit 19a is responsive to external address bits indicative of one of the bit lines BL1 to BLn, and the column selector unit 19b selects one of the bit lines BL1 to BLn under the control of the column address decoder unit 19a.

An output circuit 20 is coupled to the column selector unit 19b, and the selected bit line is electrically coupled through the column selector unit 19b to the output circuit 20. The output circuit 20 supplies current through the column selector unit 19b to the selected bit line, and monitors the current to see whether or not the selected bit line maintains the potential level. The output circuit 20 produces an output data signal Sout depending upon the potential level on the selected bit line.

A row address and block address decoder unit 21 is further incorporated in the mask ROM device, and is responsive to external address bits indicative of either memory cell sub-block and one of the memory cells M1–M9 or M10–M18 of the selected memory cell sub-block. The row address and block address decoder unit 21 changes either selecting line SL11 or SL12 of a selected set to a high level, and maintains the other selecting line SL12 or SL11 in a low level. As a result, either memory cell sub-blocks MBa or MBb of a row of memory cell blocks are coupled to the associated bit lines BL1 to BLn, respectively.

The row address and block address decoder unit 21 further changes the word lines of a selected set to the high level except for a word line coupled to an accessed memory cell. The other sets of word lines are maintained in the low level.

Assuming now that the memory cell M18 is accessed, the column address decoder unit 19a causes the column selector unit 19b to couple the output circuit 20 to the bit line BL1, and the row address and block address decoder unit 21 changes the selecting line SL11 to the high level. The other selecting line SL12 is maintained in the low level. The n-channel enhancement type switching transistor SW4 turns on, and the bit line BL1 is coupled through the switching transistors SW4 and SW3 to the memory cell sub-block MBb. However, the n-channel enhancement type switching transistor SW1 is turned off, and the other memory cell sub-block MBa is electrically isolated from the bit line BL1.

The row address and block address decoder unit 21 maintains the word line WL11 in the low level, and the other word lines WL12 to WL19 are changed to the high level. The other word lines WL12 to WL19 cause the memory cells M10 to M17 to provide a current path regardless of the operation mode, and the memory cell M18 operative in the depletion mode has the conductive channel 16y between the switching transistor SW3 and the memory cell M17 under the low level on the word line WL11. Then, the bit line BL1 is electrically coupled through the switching transistors SW4 and SW3 and the memory cell sub-block MBb to the discharging line 19.

The current is discharged to the discharging line 19, and the potential level on the bit line BL1 is decayed. The output circuit 20 produces the output data signal Sour indicative of the data bit corresponding to the depletion mode.

Description is hereinbelow made on a process sequence for fabricating the mask ROM device according to the present invention with reference to FIGS. 7A to 7F. The process sequence starts with preparation of the p-type silicon substrate 11, and n-type dopant impurity is diffused in a surface portion of the p-type silicon substrate for forming a heavily doped n-type impurity region 31. The heavily doped n-type impurity region 31 is 0.2 to 0.3 micron in depth.

Figure 7A:
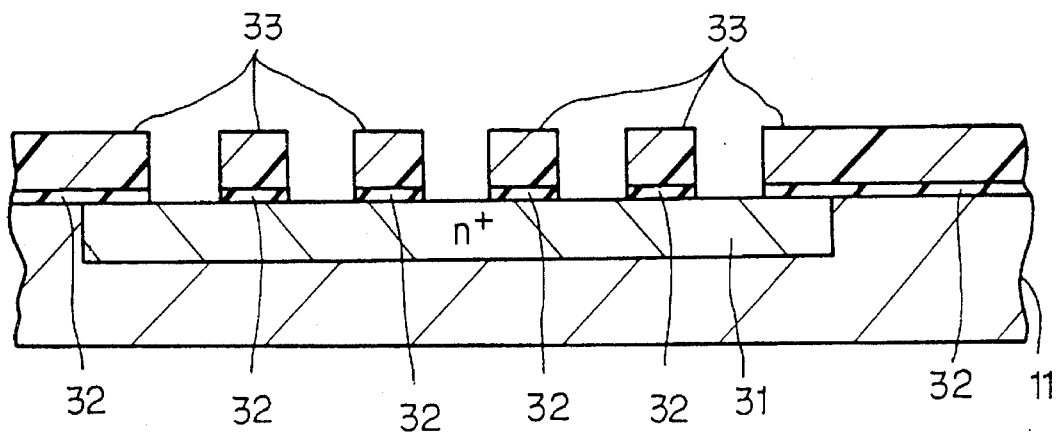
FIGS. 7A to 7H are cross sectional views showzing a process sequence for fabricating the read only memory device according to the present invention.

The major surface of the p-type silicon substrate 11 is thermally oxidized, and a mask oxide layer 32 of 0.2 micron thick covers the major surface of the p-type silicon substrate 11. Photo-resist solution is spread over the mask oxide layer 32, and the photo-resist film is patterned into a photo mask layer 33 so that the heavily-doped n-type impurity region 31 is exposed at interval of 0.4 to 0.6 micron. Using the photo mask layer 33, the mask oxide layer 32 are partially etched away, and the resultant structure at this stage is illustrated in FIG. 7A.

Figure 7B:
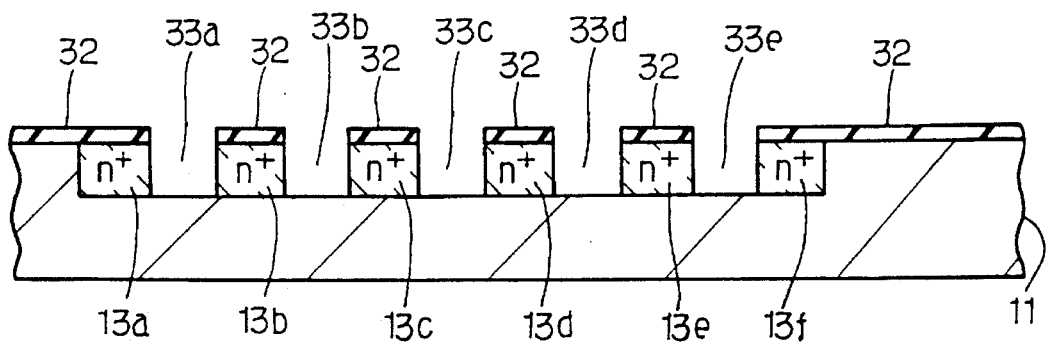

Using the photo mask layer 33 again, the exposed portions of the heavily doped n-type impurity region 31 are etched away until the p-type silicon substrate 11 is exposed to the grooves 33a, 33b, 33c, 33d and 33e formed through the etching, and the heavily doped n-type impurity regions 13a to 13f are left on the p-type silicon substrate 11. The resultant structure at this stage is illustrated in FIG. 7B.

Figure 7C:
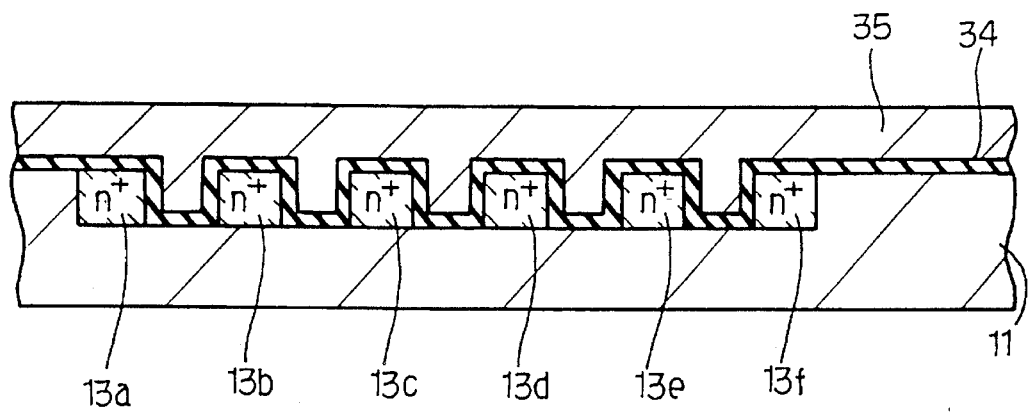

The mask oxide layer is removed from the structure, and a silicon oxide layer 34 is deposited to 0.1 to 0.2 micron thick over the entire surface of the structure, and conformally extends along the exposed surface of the heavily doped n-type impurity regions 13a to 13f. Polysilicon heavily doped n-type dopant impurity is deposited to 0.4 to 0.8 micron thick over the silicon oxide layer 34, and forms a polysilicon layer 35 with a flat top surface as shown in FIG. 7C.

The polysilicon layer 35 and the silicon oxide layer 34 are etched back or uniformly etched away until the heavily doped n-type impurity regions 13a to 13f are exposed again. As a result, the heavily-doped polysilicon strips 13g to 13k on the thin silicon oxide films 14 are left in the grooves. It is important to make the top surfaces of the heavily doped n-type impurity regions 13a to 13f coplanar with the top surfaces of the heavily doped n-type polysilicon strips 13g to 13k for preventing the channel regions 16e to 16aa from offset. The gate oxide film 15 is thermally grown to 10 to 20 nanometers thick on the surface of the structure, and an amorphous silicon layer 36 is deposited to 0.05 to 0.1 micron thick on the thin gate oxide film 15. The gate oxide film 15 may be deposited by using a chemical vapor deposition.

Figure 7D:
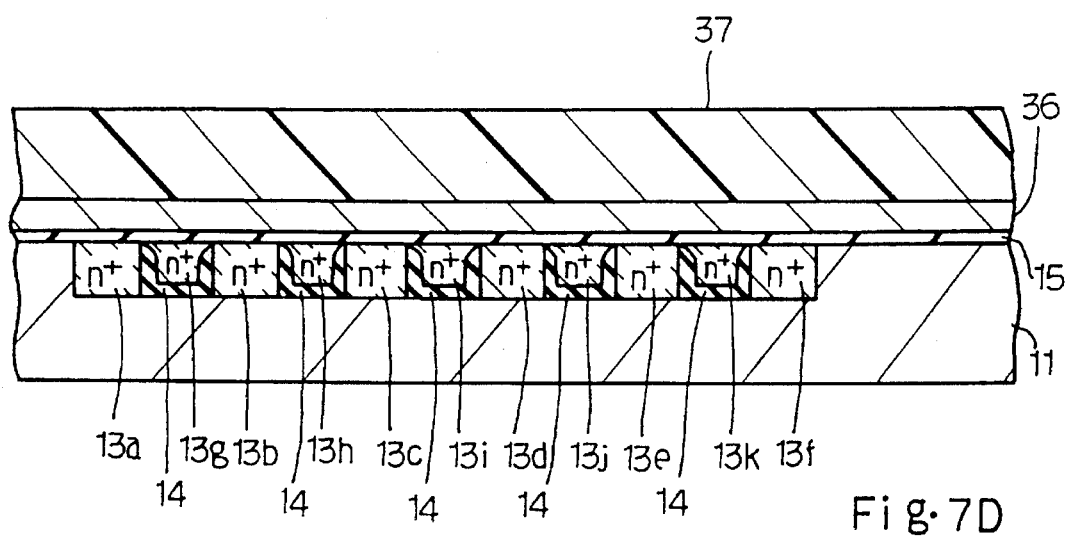

Photo-resist solution is spun onto the silicon layer 36, and the photo-resist layer is partially radiated with light. The photo-resist layer is developed in a solution, and the photo-resist layer is patterned into a mask layer 37 as shown in FIG. 7D. The mask layer 37 exposes an elongated area between the central portions 16a and 16b.

Figure 7E:
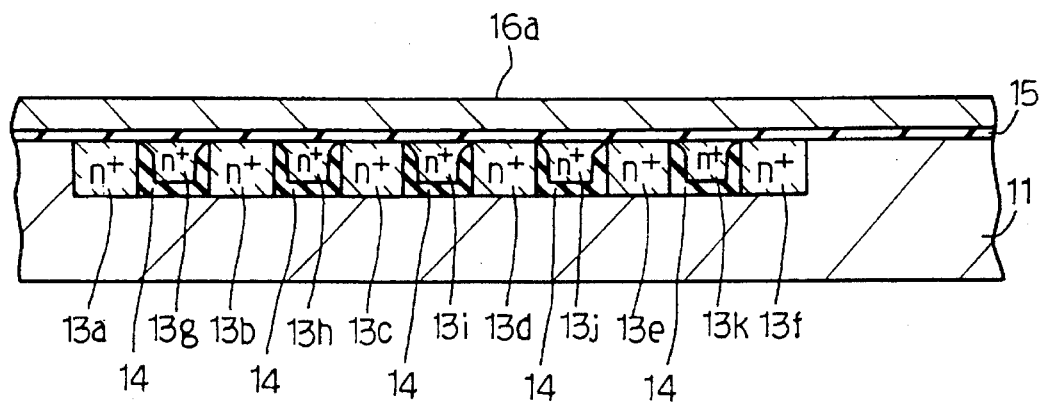

Using the mask layer 37, the exposed portion of the silicon layer 36 is etched away, and the central portions 16a and 16b and both end portions are left beneath the mask layer 37. The mask layer 37 is stripped off, and the resultant structure at this stage is illustrated in FIG. 7E. As will be understood from the description on this stage, the central portions 16a and 16b are physically spaced apart from each other through an etching process, and a gap between the central portions 16a and 16b are narrower than the thick field oxide layer 2 between the active areas of the prior art mask ROM. For this reason, the integration density of the memory cells is enhanced.

Figure 7F:
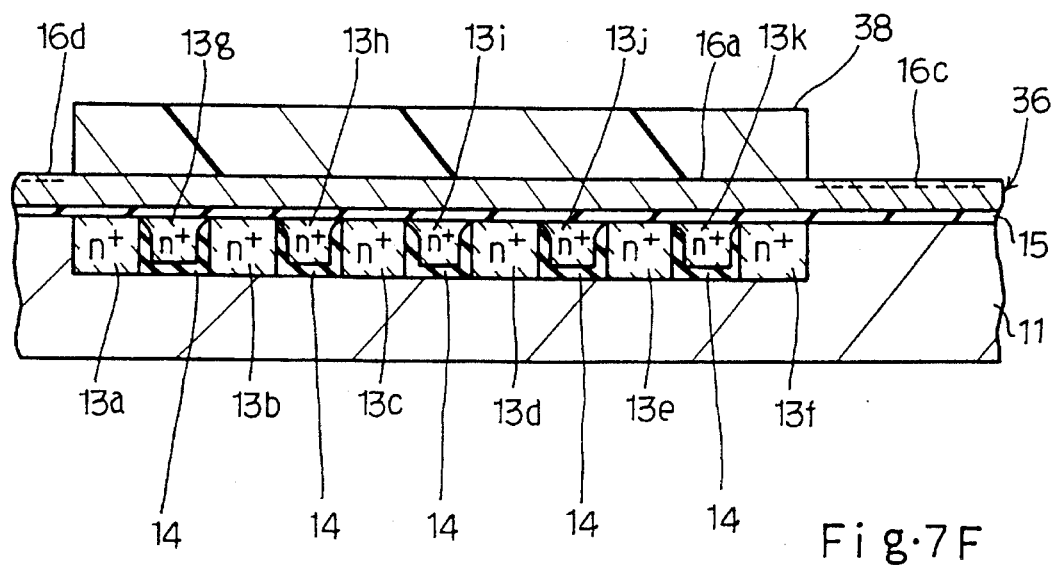

An appropriate mask layer 38 is provided on the silicon layer 36, and exposes both end areas of the silicon layer 36. N-type dopant impurity is ion implanted into exposed areas of the silicon layer 36 for forming the heavily doped n-type drain region 16c and the heavily doped n-type source region 16c. The resultant structure at this stage is illustrated in FIG. 7F.

The mask layer 38 is stripped off, and the resultant structure is stored until an user provides a specification to the manufacturer.

Figure 7G:
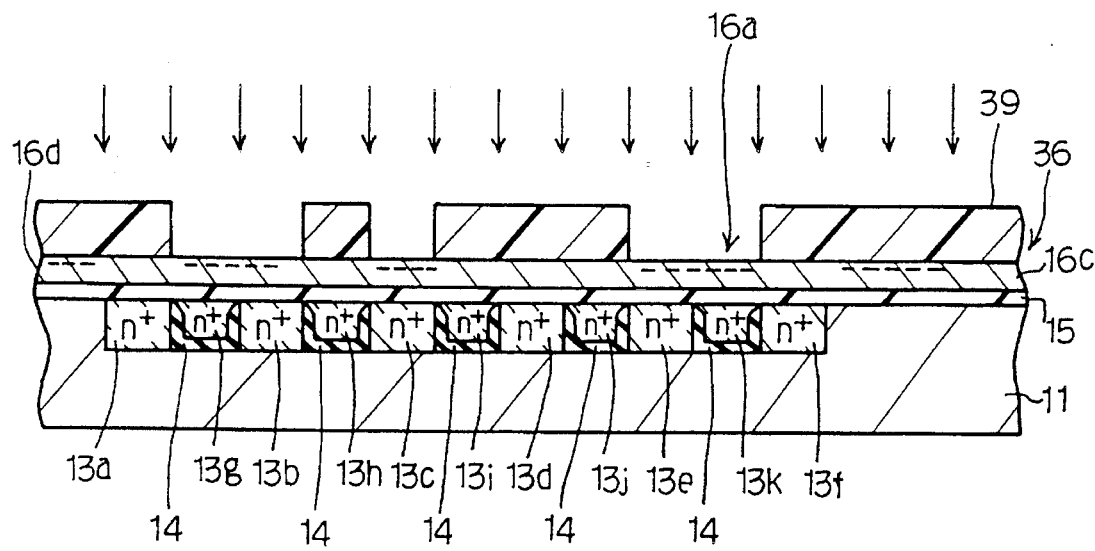

When stored data bits are determined, the manufacturer restarts the fabrication process. First, a photo-resist mask 39 is patterned on the silicon layer 36, and selectively exposes the channel regions 16e to 16aa in the central portions 16a and 16b. Phosphorous is ion implanted into the exposed portions of the central portions 16a and 16b at dose of 8E12 to 5E13 under the acceleration energy ranging from 20 KeV to 30 KeV. Thus, the ion-implantation selectively changes the field effect transistors serving as memory cells to the depletion mode. However, the photo-resist mask 39 prevents the areas therebeneath from the implanted phosphorous, and the field effect transistors with the non-implanted channel regions are operative in the enhancement mode. The programming is illustrated in FIG. 7G.

Since the silicon layer 36 is so thin that the implantation energy is lower than that of the prior art. As a result, the phosphorous is exactly implanted into the silicon layer 36, and forms expected impurity profile. Moreover, the heavily doped n-type impurity regions 13a to 13f and the heavily doped n-type polysilicon strips 13g to 13k exactly coplanar with one another do not allow the ion-implantation to leave a non-implanted area at the boundaries between the heavily doped n-type impurity regions 13a to 13f and the heavily doped n-type polysilicon strips 13g to 13k. Finally, the manufacturer can deliver the programmed mask ROM devices within a short time period after the receipt of the specification, because the programming through the ion-implantation is carried out after the completion of the field effect transistors serving as the memory cells.

Figure 7H:
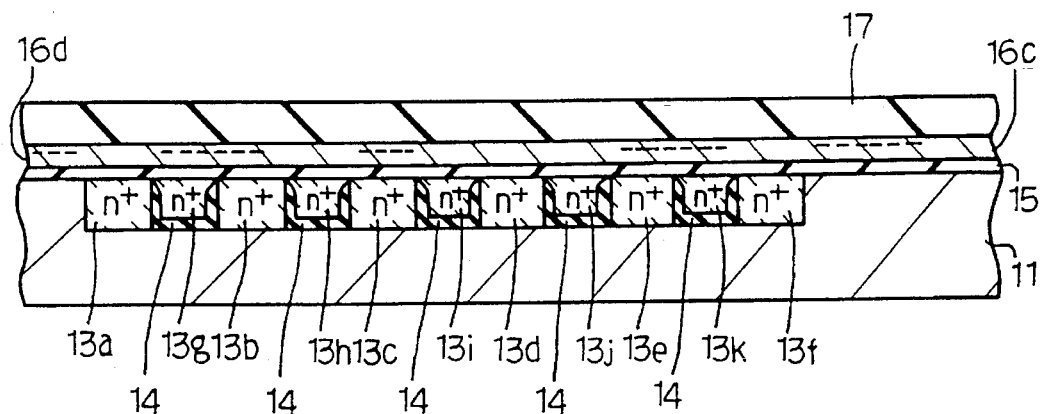

After the programming, the inter-level insulating layer 17 is deposited to 0.2 micron over the entire surface of the structure as shown in FIG. 7H, and the contact hole 17a is formed in the inter-level insulating layer 17. A metal layer is deposited on the inter-level insulating layer 17, and is patterned into the bit line BL1.

As will be appreciated from the foregoing description, the mask ROM device according to the present invention is enhanced in the integration density of the memory cells by virtue of the central portions 16a and 16b physically separated through the lithographic process. In fact, the mask ROM device implementing the first embodiment is twice as large in the integration density as the prior art mask ROM device.

Second Embodiment

Figure 8A:
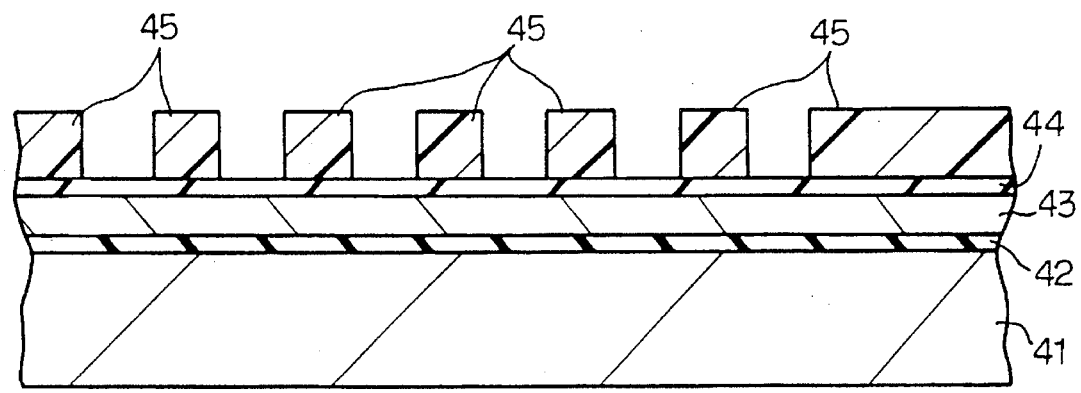
FIGS. 8A to 8F are cross sectional views showing another process sequence for fabricating a read only memory device according to the present invention.

FIGS. 8A to 8F of the drawings illustrate another process sequence for fabricating a mask ROM device embodying the present invention. The process starts with preparation of a p-type silicon substrate 41, and a silicon oxide layer 42 is deposited over the entire surface of the p-type silicon substrate 41. Heavily doped n-type polysilicon is further deposited on the silicon oxide layer 42 for forming a heavily doped n-type polysilicon layer 43. A mask oxide layer 44 covers the heavily doped n-type polysilicon layer 43, and an appropriate photo-resist mask 45 is patterned on the mask oxide layer 44 as shown in FIG. 8A.

Figure 8B:
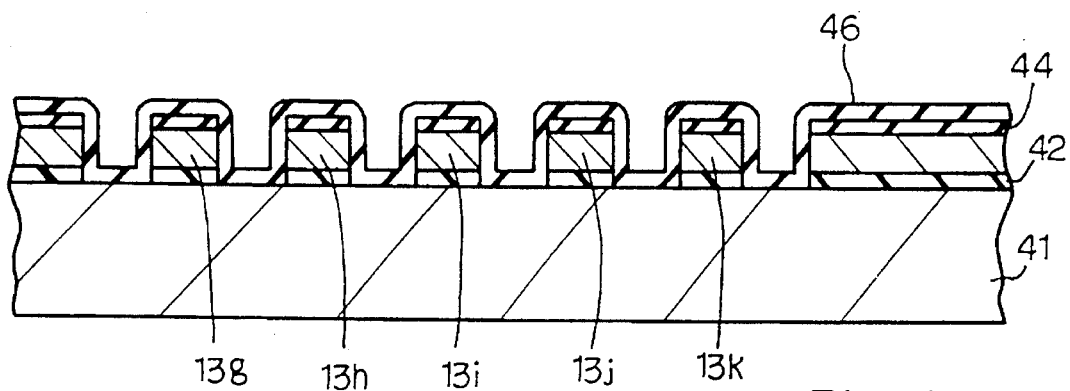

Using the photo-resist mask 45, the mask oxide layer 44 and the heavily doped n-type polysilicon layer 43 are successively etched away, and the heavily doped n-type polysilicon strips 13g, 13h, 13i, 13j and 13k are left on the silicon oxide layer 42. A silicon oxide layer 46 is conformally deposited on the entire surface of the structure as shown in FIG. 8B.

The silicon oxide layer 46 is etched back, and are left on the side surfaces of the heavily doped n-type polysilicon strips 13g to 13k. As a result, the polysilicon strips 13g to 13k are wrapped in the silicon oxide layers 42, 44 and 46, and the p-type silicon substrate 41 is exposed to the grooves between the silicon oxide layers 46.

Figure 8C:
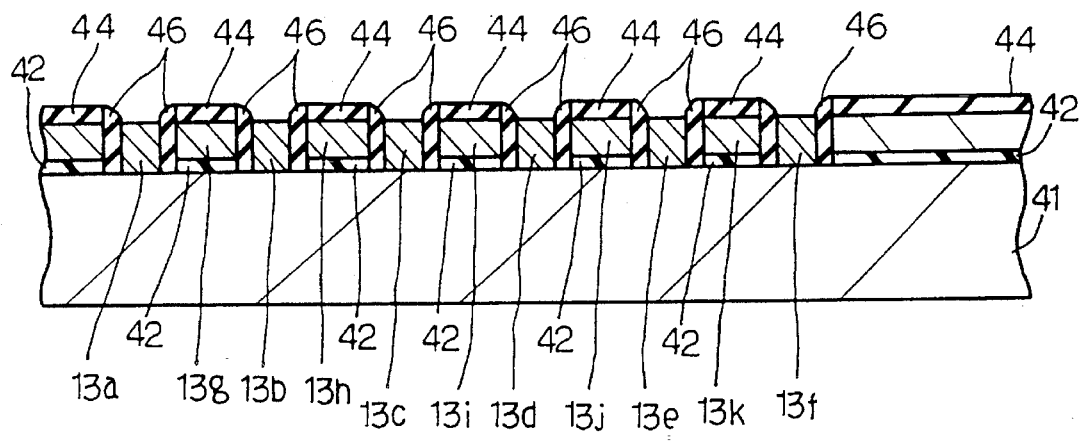

Single crystalline silicon is epitaxially grown on the exposed areas of the p-type silicon substrate 41, and n-type dopant impurity is introduced in the silicon strips grown on the p-type silicon substrate 41. For this reason, the grooves are filled with heavily doped n-type silicon strips 13a to 13f, and the top surfaces of the heavily doped n-type silicon strips 13a to 13f are substantially coplanar with the top surface of the heavily doped n-type polysilicon strips 13g to 13k. The resultant structure at this stage is illustrated in FIG. 8C.

The silicon oxide layers 44 and 46 are uniformly etched away until the top surface of the heavily doped n-type polysilicon strips 13g to 13k are exposed. The gate oxide layer 15 is grown, and the amorphous silicon layer 36 is deposited over the entire surface of the structure.

Figure 8D:
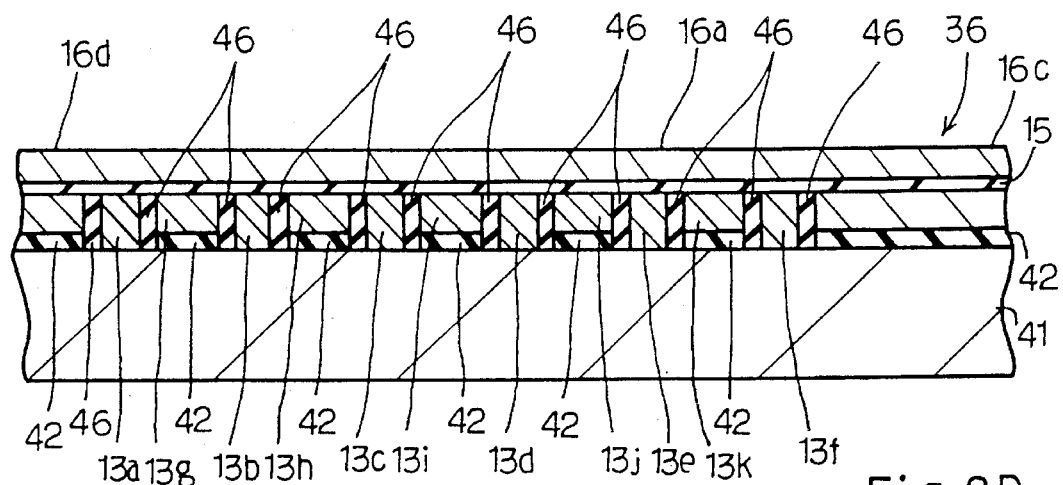

The silicon layer 36 is partially removed for forming the central portions 16a and 16b, and n-type dopant impurity is introduced in both side portions of the silicon layer 36 for forming the heavily doped n-type drain region 16c and the heavily doped n-type source region 16d as shown in FIG. 8D.

Figure 8E:
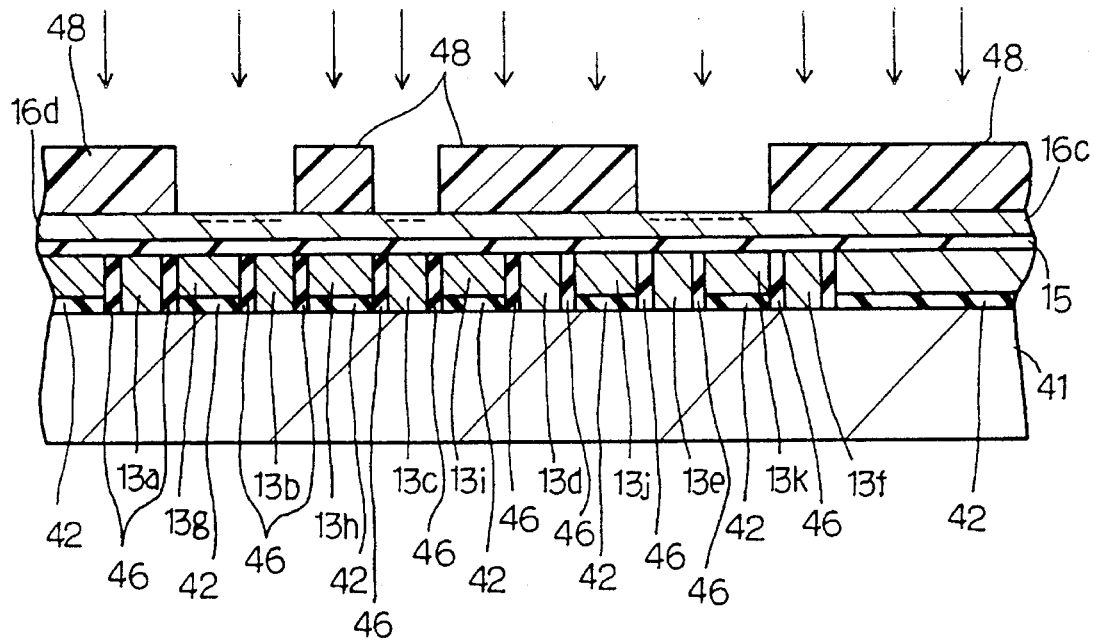

After determination of stored data, a photo-resist mask 48 is patterned on the silicon layer 36, and selectively exposes channel regions in the central portions 16a and 16b. N-type dopant impurity is ion implanted into the exposed channel regions as shown in FIG. 8E.

Figure 8F:
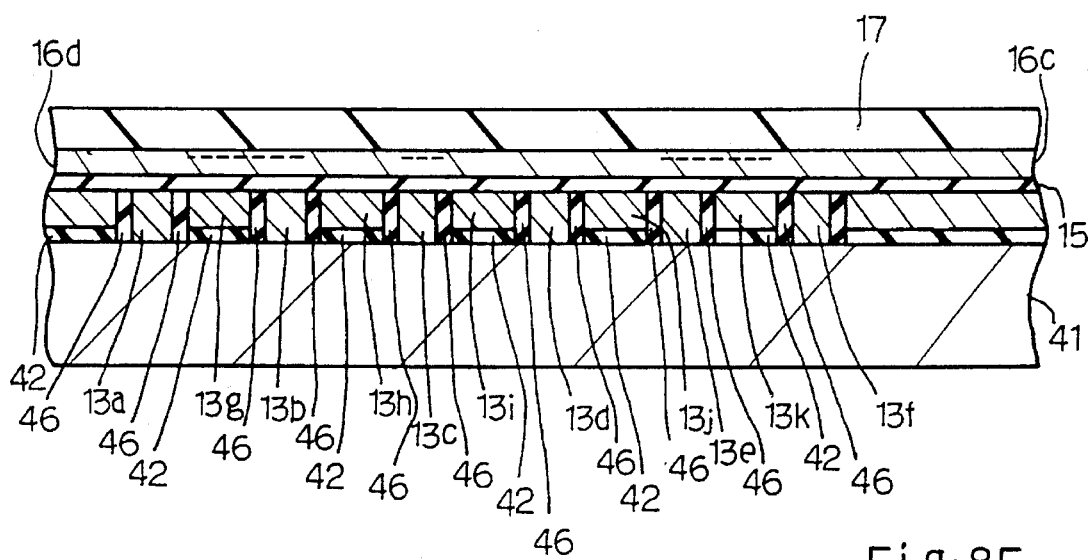

The photo-resist mask 48 is stripped off, and the inter-level insulating layer 17 is deposited over the entire surface of the structure as shown in FIG. 8F. The contact hole 17a is formed in the inter-level insulating layer 17, and the bit line BL1 is formed on the inter-level insulating layer 17.

The central portions 16a and 16b are physically spaced apart through the lithographic process, and the memory cells are integrated on the p-type silicon substrate 41 at high density. In fact, the mask ROM device implementing the second embodiment is twice as large in the integration density as the prior art mask ROM device.

Third Embodiment

Figure 9A:
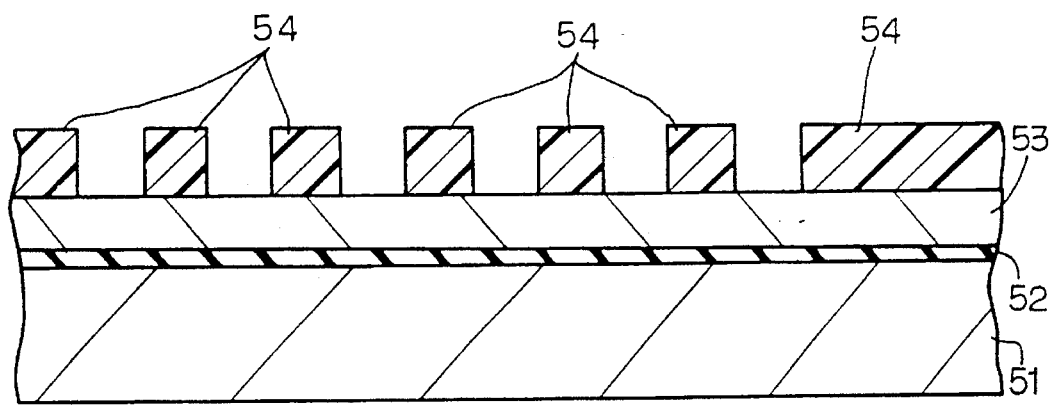
FIGS. 9A to 9F are cross sectional views showing yet another process sequence for fabricating a read only memory device according to the present invention.

FIGS. 9A to 9F illustrates yet another process sequence for fabricating a mask ROM device embodying the present invention. The process starts with preparation of a p-type silicon substrate 51, and a silicon oxide layer 52 is deposited over the entire surface of the p-type silicon substrate 51. Heavily doped n-type polysilicon is further deposited on the silicon oxide layer 52 for forming a heavily doped n-type polysilicon layer 53. An appropriate photo-resist mask 54 is patterned on the heavily doped n-type polysilicon layer 53 as shown in FIG. 9A.

Figure 9B:
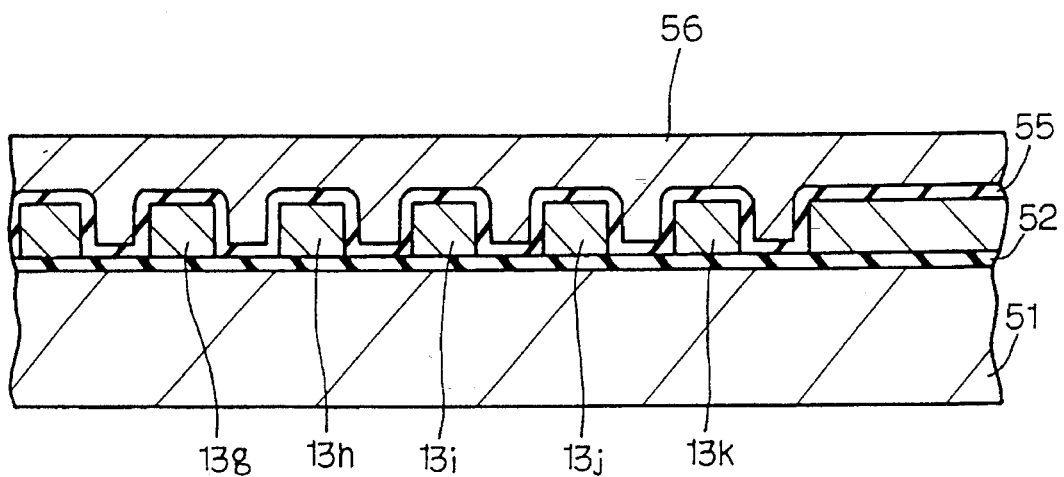

Using the photo-resist mask 54, the heavily doped n-type polysilicon layer 53 is partially etched away, and the heavily doped n-type polysilicon strips 13g, 13h, 13i, 13j and 13k are left on the silicon oxide layer 52. A silicon oxide layer 55 is conformally deposited on the entire surface of the structure, and doped polysilicon is deposited on the silicon oxide layer 55 for forming a doped polysilicon layer 56 as shown in FIG. 9B.

Figure 9C:
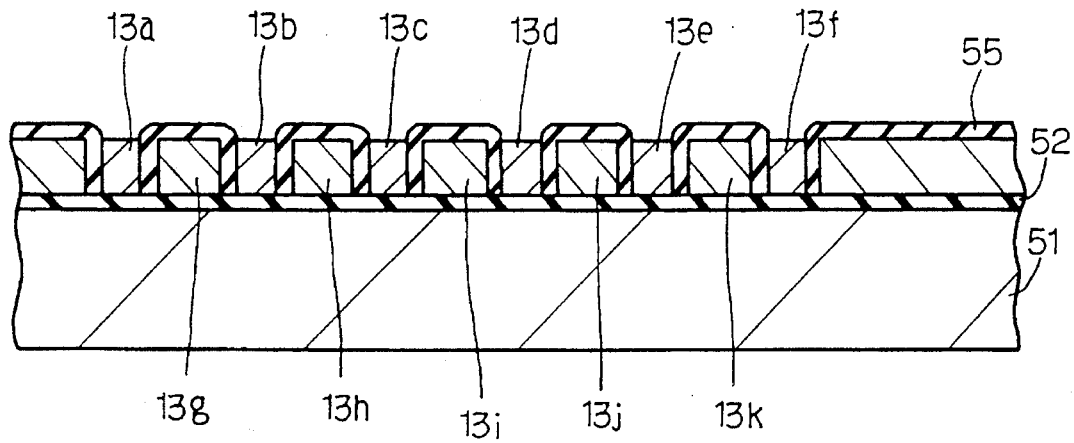

The heavily doped n-type doped polysilicon layer 56 is etched back, and heavily doped n-type polysilicon strips 13a to 13f are left in the grooves between the heavily doped n-type polysilicon strips 13g to 13k. The top surfaces of the heavily doped n-type silicon strips 13a to 13f are substantially coplanar with the top surface of the heavily doped n-type polysilicon strips 13g to 13k. The resultant structure at this stage is illustrated in FIG. 9C.

The silicon oxide layer 55 is uniformly etched away until the top surface of the heavily doped n-type polysilicon strips 13a to 13k are exposed. The gate oxide layer 15 is grown, and the amorphous silicon layer 36 is deposited over the entire surface of the structure.

Figure 9D:
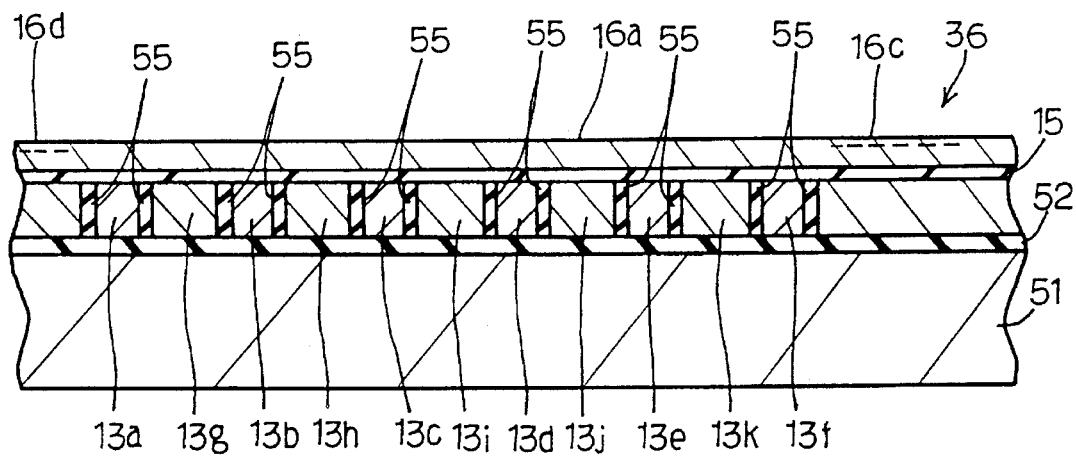

The silicon layer 36 is partially removed for forming the central portions 16a and 16b, and n-type dopant impurity is introduced in both side portions of the silicon layer 36 for forming the heavily doped n-type drain region 16c and the heavily doped n-type source region 16d as shown in FIG. 9D.

Figure 9E:
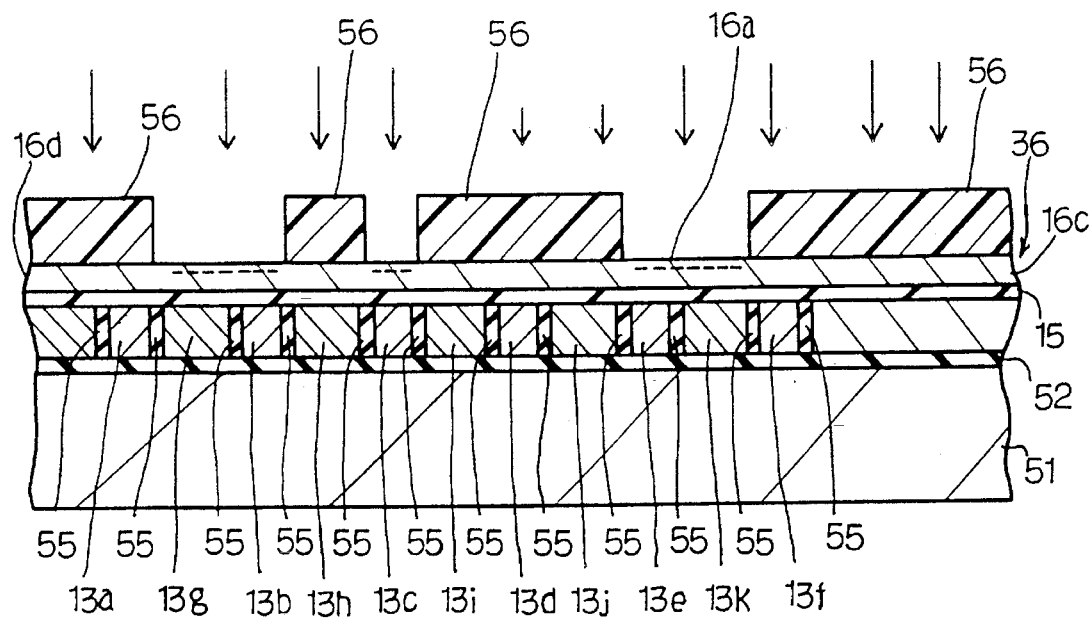

After determination of stored data, a photo-resist mask 56 is patterned on the silicon layer 36, and selectively exposes channel regions in the central portions 16a and 16b. N-type dopant impurity is ion implanted into the exposed channel regions as shown in FIG. 9E.

Figure 9F:
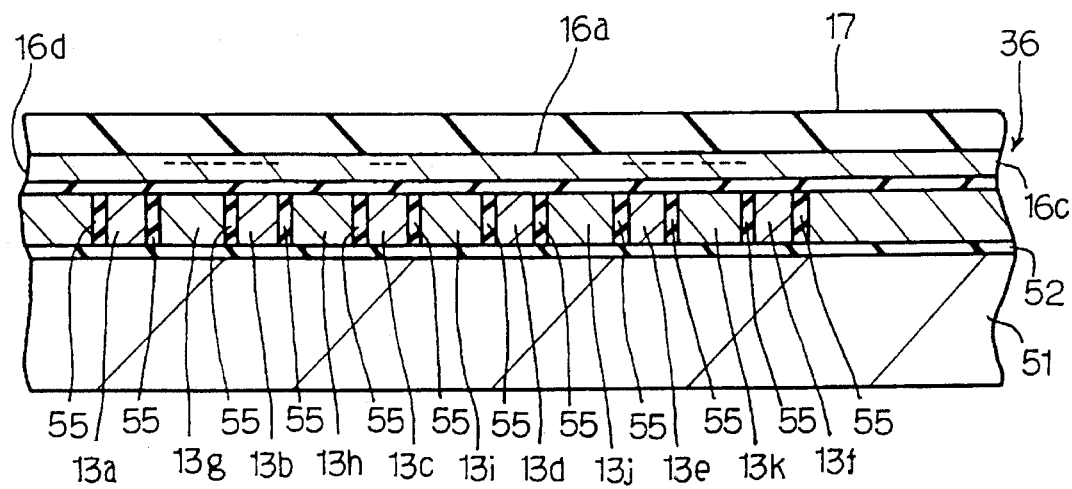

The photo-resist mask 56 is stripped off, and the inter-level insulating layer 17 is deposited over the entire surface of the structure as shown in FIG. 9F. The contact hole 17a is formed in the inter-level insulating layer 17, and the bit line BL1 is formed on the inter-level insulating layer 17.

The central portions 16a and 16b are physically spaced apart through the lithographic process, and the memory cells are integrated on the p-type silicon substrate 51 at high density. The mask ROM device implementing the third embodiment is twice as large in the integration density as the prior art mask ROM device.

Fourth Embodiment

Figure 10:
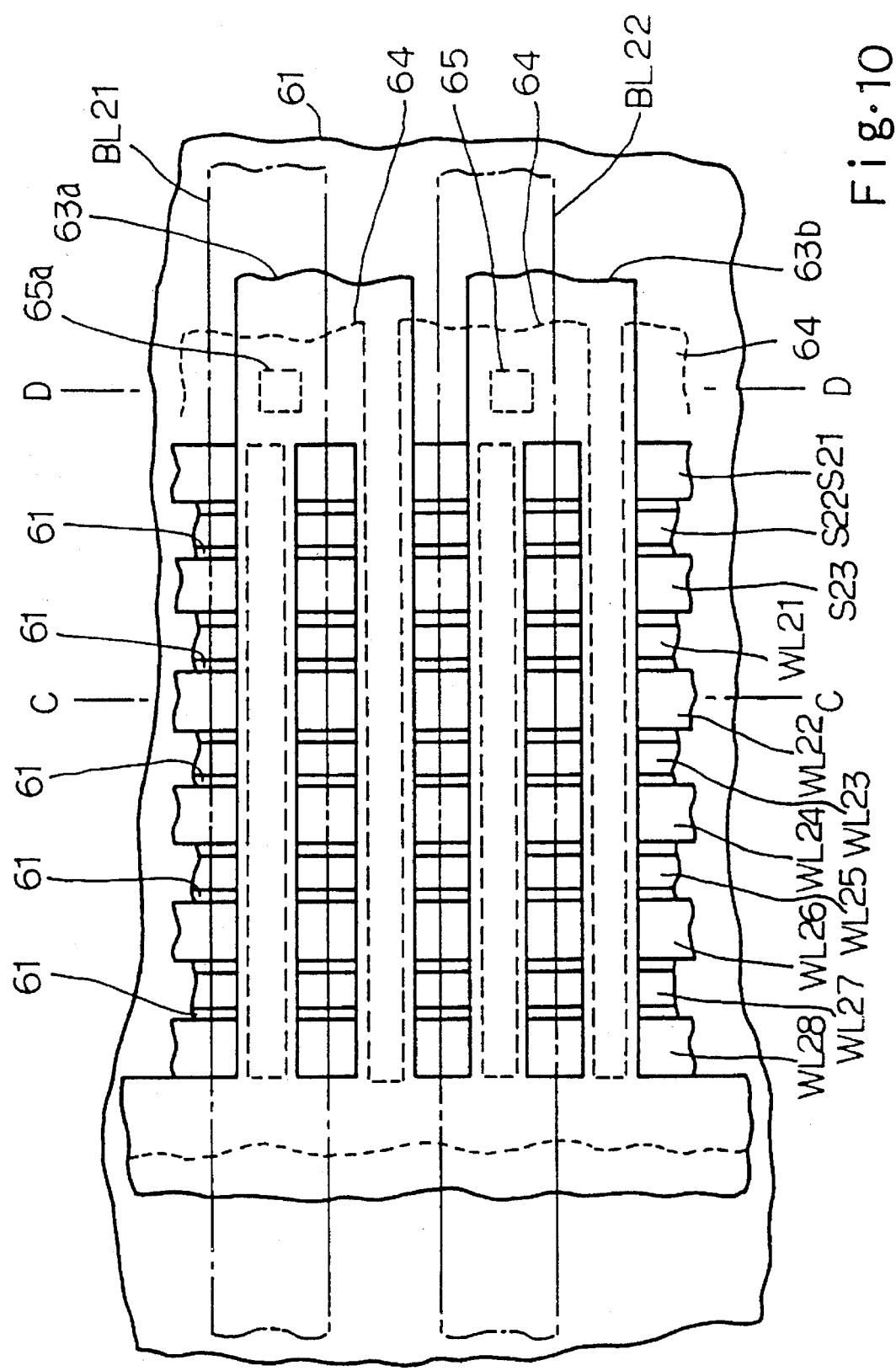
FIG. 10 is a plan view showing the layout of yet another read only memory device according to the present invention.
Figure 11:
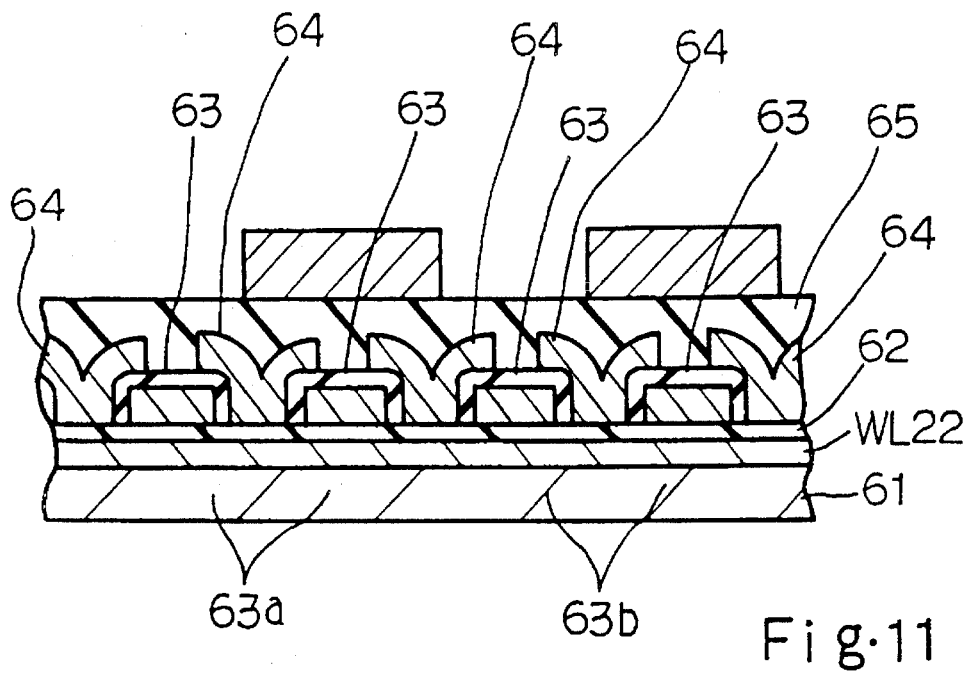
FIG. 11 is a cross sectional view taken along lines C—C of FIG. 10.
Figure 12:
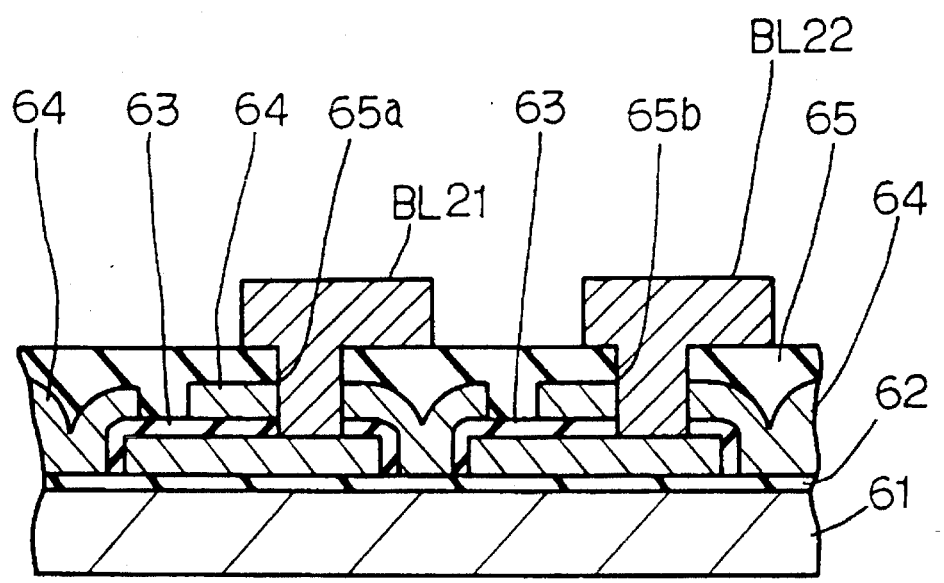
FIG. 12 is a cross sectional view taken along lines D—D of FIG. 10.

Turning to FIGS. 10 to 12 of the drawings, still another mask ROM device embodying the present invention is fabricated on a p-type silicon substrate 61. Word lines and selecting lines are labeled with WL21 to WL28 and S21 to S23, and the selecting line S2 and the word lines WL21, WL23, WL25 and WL27 are covered with insulating films 61. A gate oxide film 62 covers the top surfaces of the word lines WL21 to WL28 and the top surfaces of the selecting lines S21 to S23. However, the gate oxide film 62 is deleted from FIG. 10.

Partially bifurcated first silicon layers 63a and 63b are formed on the gate oxide film 62, and provide channel regions for memory cells. Insulating films 63 covers the partially bifurcated first silicon layers 63a and 63b, and second silicon layers 64 fill the gaps between the partially bifurcated first silicon layers 63a and 63b for providing channel regions for memory cells.

An inter-level insulating layer 65 covers the partially bifurcated first silicon layers 63a and 63b and second silicon layers 64. However, the inter-level insulating layer 65 is deleted from FIG. 10.

Contact holes 65a and 65b are formed in the interlevel insulating layer 65, and bit lines BL21 and BL22 are held in contact through the contact holes 65a and 65b with the partially bifurcated first silicon layers 63a and 63b and the second silicon layers 64.

The thin insulating films 63 electrically isolates the partially bifurcated first silicon layers 63a and 63b from the second silicon layers 64, and the partially bifurcated first silicon layers 63a/63b and the second silicon layers 64 are tightly arranged on the gate oxide layer 62, and for this reason, the integration density of the memory cells are further enhanced rather than the first to third embodiment.

Although particular embodiments of the present invention have been shown and described, it will be obvious to those skilled in the art that various changes and modifications may be made without departing from the spirit and scope of the present invention.

What is claimed is:

1. A semiconductor read only memory device fabricated on a semiconductor bulk substrate, and having a plurality of memory cell blocks each including series combinations of memory cells and switching transistors, each of the memory cell blocks comprising:

a) a plurality of conductive strips including elongated impurity regions at intervals in surface portions of said semiconductor bulk substrate and semiconductor strips in grooves between said elongated impurity regions, said plurality of conductive strips having respective top surfaces, and providing gate electrodes of said series combinations of memory cells and switching transistors, b) a plurality of first insulating films in said grooves for electrically isolating said plurality of conductive strips from one another, c) a gate insulating layer covering the top surfaces of said plurality of conductive strips, and d) a plurality of semiconductor layers extending over said gate insulating layer and spaced apart from one another, said plurality of semiconductor layers being respectively associated with said series combinations of memory cells and switching transistors for providing channel regions of the memory cells and channel regions of the switching transistors.

2. The semiconductor read only memory device as set forth in claim 1, in which said semiconductor bulk substrate is of silicon, and said semiconductor strips are of polysilicon.

3. The semiconductor read only memory device as set forth in claim 1, in which said semiconductor bulk substrate is a doped polysilicon layer laminated on a silicon substrate, and said semiconductor strips are of epitaxial silicon.

4. The semiconductor read only memory device as set forth in claim 1, in which said semiconductor bulk substrate is a doped polysilicon layer laminated on a substrate insulating layer covering a silicon substrate, and said semiconductor strips are of doped polysilicon.

5. The semiconductor read only memory device as set forth in claim 1, further comprising:

a plurality of second insulating films respectively covering said plurality of semiconductor layers, and a plurality of second semiconductor layers extending on a gate insulating film between said plurality of second insulating films, said plurality of second semiconductor layers being respectively associated with other series combinations of memory cells and switching transistors forming in combination another memory cell block.

6. The read only memory device as set forth in claim 1, in which the top surfaces of adjacent two conductive strips of said plurality of conductive strips are substantially coplanar.

* * * * *